US010081576B2

(12) United States Patent
Ashizawa et al.

(10) Patent No.: US 10,081,576 B2
(45) Date of Patent: Sep. 25, 2018

(54) STRUCTURE

(71) Applicant: TOTO LTD., Kitakyushu-shi, Fukuoka (JP)

(72) Inventors: Hiroaki Ashizawa, Kitakyushu (JP); Masakatsu Kiyohara, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 15/716,865

(22) Filed: Sep. 27, 2017

(65) Prior Publication Data

US 2018/0127320 A1    May 10, 2018

(30) Foreign Application Priority Data

Nov. 10, 2016  (JP) ................. 2016-219788
Sep. 22, 2017  (JP) ................. 2017-182307

(51) Int. Cl.
| | | |
|---|---|---|
| *C04B 35/50* | (2006.01) | |
| *C04B 35/553* | (2006.01) | |
| *H01J 37/32* | (2006.01) | |
| *C04B 35/515* | (2006.01) | |

(52) U.S. Cl.
CPC .... *C04B 35/5156* (2013.01); *H01J 37/32495* (2013.01); *C04B 2235/445* (2013.01); *C04B 2235/76* (2013.01); *C04B 2235/781* (2013.01)

(58) Field of Classification Search
CPC ............... C04B 35/5156; C04B 35/553; H01J 37/32495
See application file for complete search history.

(56) References Cited

U.S. PATENT DOCUMENTS

| | | | |
|---|---|---|---|
| 9,388,485 B2* | 7/2016 | Fukagawa | ................. C23C 4/10 |
| 9,914,993 B2* | 3/2018 | Ibe | ............................ C23C 4/04 |
| 2015/0096462 A1* | 4/2015 | Fukagawa | ................. C23C 4/10 |
| | | | 106/14.05 |
| 2016/0244868 A1* | 8/2016 | Ibe | ............................ C23C 4/04 |
| 2016/0326058 A1* | 11/2016 | Nagayama | ................ C23C 4/04 |
| 2016/0326059 A1* | 11/2016 | Nagayama | ............ C04B 35/505 |

* cited by examiner

*Primary Examiner* — Karl E Group
(74) *Attorney, Agent, or Firm* — Carrier Blackman & Associates, P.C.; Joseph P. Carrier; William D. Blackman (57) ABSTRACT

According to one embodiment, a structure includes a polycrystalline substance of yttrium oxyfluoride as a main component. The yttrium oxyfluoride has a rhombohedral crystal structure, and an average crystallite size of the polycrystalline substance is less than 100 nanometers. When taking a peak intensity of rhombohedron detected near diffraction angle $2\theta=13.8°$ by X-ray diffraction as r1, taking a peak intensity of rhombohedron detected near diffraction angle $2\theta=36.1°$ as r2, and taking a proportion $\gamma 1$ as $\gamma 1(\%)=r2/r1\times 100$, the proportion $\gamma 1$ is not less than 0% and less than 100%.

13 Claims, 6 Drawing Sheets

|  | SOURCE MATERIAL | FILM MANUFACTURING CONDITION | | STRUCTURE | | |
| --- | --- | --- | --- | --- | --- | --- |
|  |  | GAS | FLOW RATE (L/min) | $\gamma_1$ (%) | $\gamma_2$ (%) | PLASMA RESISTANCE |
| SAMPLE 1 | F1 | $N_2$ | 10 | 0 | 0 | ◎ |
| SAMPLE 2 | F2 | $N_2$ | 10 | 0 | 0 | ◎ |
| SAMPLE 3 | F5 | $N_2$ | 10 | 44 | 18 | ○ |
| SAMPLE 4 | F5 | He | 5 | 55 | 27 | ○ |
| SAMPLE 5 | F3 | $N_2$ | 10 | – | 74 | △ |
| SAMPLE 6 | F2 | He | 5 | 157 | 84 | △ |
| SAMPLE 7 | F4 | He | 3 | 122 | 106 | × |
| SAMPLE 8 | F6 | $N_2$ | 10 | 0 | 0 | ◎ |
| SAMPLE 9 | F7 | $N_2$ | 10 | 72 | 0 | ○ |
| SAMPLE 10 | F8 | $N_2$ | 10 | 57 | 0 | ○ |

STRUCTURE

CROSS-REFERENCE TO RELATED APPLICATIONS

This application is based upon and claims the benefit of priority from Japanese Patent Application No. 2016-219788, filed on Nov. 10, 2016, and the priority from Japanese Patent Application No. 2017-182307, filed on Sep. 22, 2017; the entire contents of which are incorporated herein by reference.

FIELD

Embodiments described herein relate generally to a structure.

BACKGROUND

As a member used under a plasma irradiation environment such as a semiconductor manufacturing apparatus, a member having a highly plasma resistant coat formed on the surface of the member is used. The coat is based on, for example, an oxide such as alumina ($Al_2O_3$), yttria ($Y_2O_3$) or the like, or a nitride such as aluminum nitride (AlN) or the like.

On the other hand, in an oxide-based ceramics, a volume of a film expands and a crack or the like occurs with fluoridation due to a reaction with a CF-based gas, and as a result, particles are generated, therefore use of fluoride-based ceramics such as originally fluoridated yttrium fluoride ($YF_3$) or the like is proposed (JP 2013-140950 A (Kokai)).

On the reason that although $YF_3$ is highly resistant to an F-based plasma, $YF_3$ is insufficiently resistant to a Cl-based plasma, or chemical stability of fluoride is doubtful, use of a thermal spray film or a sintered body of yttrium oxyfluoride (YOF) is proposed (JP 2014-009361 (Kokai), JP 2016-098143 A (Kokai)).

For example, it is also considered that a thermal spray film is formed by using oxyfluoride of a rare-earth element as a source material (Japanese Patent No. 5927656). However, in the thermal spray, the film is oxidized by oxygen in the atmosphere upon heating. Therefore, $Y_2O_3$ may be mixed in the obtained thermal spray film and control of compositions may be difficult. The thermal spray film has yet a problem in denseness. There is a problem that if a chamber with $YF_3$ coated by a thermal spray or the like is used in plasma etching, an etching rate drifts and is unstable (United States Patent Application Publication No. 2015/0126036). It is also discussed that after forming a film including $Y_2O_3$, the film is fluoridated by annealing such as plasma treatment or the like (United States Patent Application Publication No. 2016/273095). However, since fluoridation treatment is performed to film including $Y_2O_3$ in this method, there is a fear that a trouble occurs, namely, a volume of the film may change by fluoridation and may be peeled off from a base, or a crack occurs in the film. It is also difficult to control a composition of the whole film. In the thermal spray film and the sintered body, $F_2$ gas is released by thermal decomposition of fluoride source material fine particles during heating, and there is a problem in safety.

On the other hand, JP 2005-217351 A (Kokai) discloses that it is possible to form the highly plasma resistant structure of $Y_2O_3$ at a normal temperature by an aerosol deposition method. However, the aerosol deposition method using yttrium oxyfluoride has not been discussed sufficiently.

DETAILED DESCRIPTION

The first invention is a structure including a polycrystalline substance of yttrium oxyfluoride as a main component, the yttrium oxyfluoride having a rhombohedral crystal structure, and an average crystallite size of the polycrystalline substance being less than 100 nanometers, when taking a peak intensity of rhombohedron detected near diffraction angle $2\theta=13.8°$ by X-ray diffraction as r1, taking a peak intensity of rhombohedron detected near diffraction angle $2\theta=36.1°$ as r2, and taking a proportion $\gamma1$ as $\gamma1(\%)=r2/r1\times100$, the proportion $\gamma1$ being not less than 0% and less than 100%.

The second invention is the structure in the first invention, wherein the proportion $\gamma1$ is less than 80%.

The inventors of the application have found that a prescribed peak intensity ratio (proportion $\gamma1$) of rhombohedral yttrium oxyfluoride is correlated with the plasma resistance. In the case of the proportion $\gamma1$ not less than 100%, decrease of the plasma resistance performance is found. It is possible to develop the practically excellent plasma resistance performance by setting the proportion $\gamma1$ to be not less than 0% and less than 100%, preferably less than 80%.

The third invention is the structure in the first or second invention, wherein the structure does not include yttrium oxyfluoride having an orthorhombic crystal structure, or further includes yttrium oxyfluoride having the orthorhombic crystal structure, when taking a peak intensity of orthorhombus detected near diffraction angle $2\theta=16.1°$ by X-ray diffraction as o, and taking a proportion of orthorhombus to rhombohedron as $\gamma2(\%)=o/r1\times100$, the proportion $\gamma2$ is not less than 0% and less than 100%.

The inventors of the application have found that a proportion of a compound or a crystal phase in the structure (proportion $\gamma2$) is correlated with the plasma resistance. In the case of the proportion $\gamma2$ not less than 100%, decrease of the plasma resistance is found. The plasma resistance can be increased by setting the proportion $\gamma2$ to be not less than 0% and less than 100%.

The fourth invention is the structure in one of the first to third inventions, wherein the yttrium oxyfluoride having the rhombohedral crystal structure is the structure of YOF.

The fifth invention is the structure in the third invention, wherein the yttrium oxyfluoride having the orthorhombic crystal structure is the structure of YOF of 1:1:2.

According to these structures, the plasma resistance can be increased.

The sixth invention is the structure in the third invention, wherein the proportion γ2 is not more than 85%.

The seventh invention is the structure in the third invention, wherein the proportion γ2 is not more than 70%.

The eighth invention is the structure in the third invention, wherein the proportion γ2 is not more than 30%.

According to these structures, the plasma resistance can be increased.

The ninth invention is the structure one of the first to eighth inventions, wherein the average crystallite size is less than 50 nanometers.

The tenth invention is the structure in one of the first to eighth inventions, wherein the average crystallite size is less than 30 nanometers.

The eleventh invention is the structure in one of the first to eighth inventions, wherein the average crystallite size is less than 20 nanometers.

According to these structures, particles generated by plasma can be small because of a small average crystallite size.

The twelfth invention is the structure in one of the first to eleventh inventions, wherein when taking a peak intensity detected near diffraction angle 2θ=29.1° by X-ray diffraction as ε, at least one of a proportion of the ε to the r1 and a proportion of the ε to the r2 is less than 1%.

According to this structure, since $Y_2O_3$ included in the structure is slight, fluoridation by CH-based plasma is suppressed, and the plasma resistance can be further increased.

The thirteenth invention is the structure in one of the first to eleventh inventions, wherein when taking a peak intensity detected near diffraction angle 2θ=29.1° by X-ray diffraction as ε, at least one of a proportion of the ε to the r1 and a proportion of the ε to the r2 is 0%.

According to this structure, since $Y_2O_3$ is not included substantially, fluoridation by CF-based plasma is suppressed, and the plasma resistance can be further increased.

Various embodiments will be described hereinafter with reference to the accompanying drawings. In the drawings, similar components are marked with like reference numerals, and a detailed description is omitted as appropriate.

Figure 1:
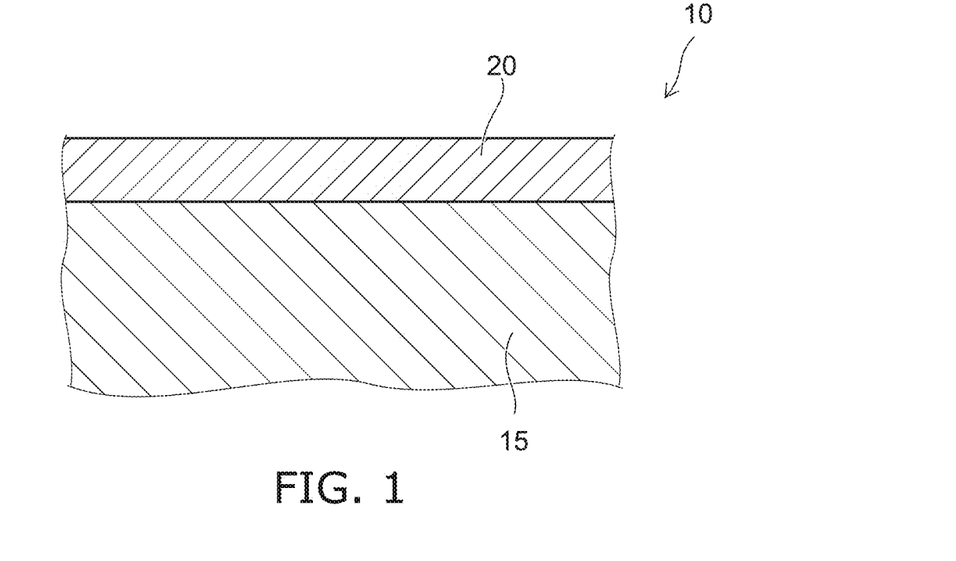
FIG. 1 is a cross sectional view illustrating a member having a structure according to an embodiment.

FIG. 1 is a cross sectional view illustrating a member having a structure according to an embodiment.

As shown in FIG. 1, a member 10 is a composite structure including, for example, a base 15, and a structure 20.

The member 10 is, for example, a member for a semiconductor manufacturing apparatus including a chamber, and is provided inside the chamber. Since a gas is introduced inside the chamber and plasma is produced, the member 10 is required to be plasma resistant. The member 10 (structure 20) may be used for other than the inside of the chamber, and the semiconductor manufacturing apparatus includes an arbitrary semiconductor manufacturing apparatus (semiconductor processing apparatus) performing processing such annealing, etching, sputtering, CVD or the like. The member 10 (structure 20) may be used for a member other than the semiconductor manufacturing apparatus.

The base 15 includes alumina, for example. However, a material of the base is not limited to ceramics such as alumina, and may be quartz, alumite, metal or glass or the like. In this example, the member 10 including the base 15 and the structure 20 is described. An aspect of only the structure 20 without the base 15 is also encompassed in the embodiment. An arithmetic average roughness Ra (JISB0601:2001) of a surface of the base 15 (surface on which the structure 20 is formed) is, for example, less than 5 micrometers (μm), preferably less than 1 μm, more preferably less than 0.5 μm.

The structure 20 includes a polycrystalline substance of yttrium oxyfluoride having a rhombohedral crystal structure. A main component of the structure 20 is a polycrystalline substance of yttrium oxyfluoride (YOF) having a rhombohedral crystal structure.

In the specification of the application, the main component of the structure refers to a compound included relatively more than other compounds included in the structure 20 from quantitative or a semi-quantitative analysis by X-ray diffraction (XRD) of the structure. For example, the main component is the most abundant compound included in the structure, and a proportion of the main component in the entire structure is greater than 50% by a volume ratio or a mass ratio. The proportion of the main component is more preferably greater than 70% and also preferably greater than 90%. The proportion of the main component may be 100%.

Yttrium oxyfluoride is a compound of yttrium (Y), oxygen (O) and fluorine (F). Yttrium oxyfluoride includes, for example, YOF of 1:1:1 (molar ratio is Y:O:F=1:1:1), YOF of 1:1:2 (molar ratio is Y:O:F=1:1:2). In the specification of the application, a range of Y:O:F=1:1:2 is not limited to composition of Y:O:F being precisely 1:1:2, and may include composition of a molar ratio of fluorine to yttrium (F/Y) being greater than 1 and less than 3. For example, supposing yttrium oxyfluoride of Y:O:F=1:1:2, $Y_5O_4F_7$ (molar ratio is Y:O:F=5:4:7), $Y_6O_5F_8$ (molar ratio is Y:O:F=6:5:8), $Y_7O_6F_9$ (molar ratio is Y:O:F=7:6:9), $Y_{17}O_{14}F_{23}$ (molar ratio is 17:14:23) are included. In the specification of the application, in the case of simply saying "YOF", it means Y:O:F=1:1:1 and in the case of "YOF of 1:1:2", it means Y:O:F=1:1:2 described above. The range of yttrium oxyfluoride may include compositions other than the above.

Figure 6:
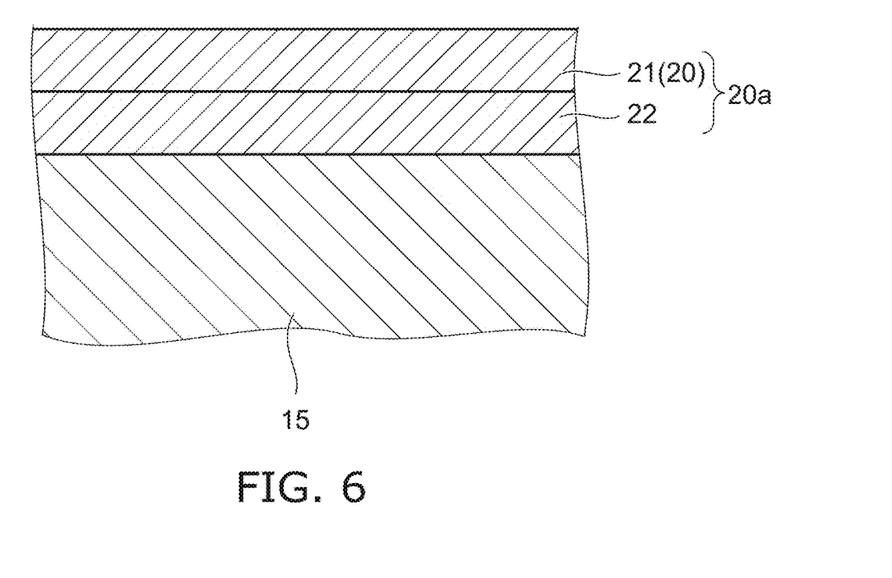
FIG. 6 is a cross sectional view illustrating a member of another structure according to the embodiment.

In the example of FIG. 1, the structure 20 has a single layer structure, however the structure formed on the base 15 may include a multilayer structure (see FIG. 6). For example, another layer 22 (for example, a layer including $Y_2O_3$) may be provided between the base 15 and a layer 21 corresponding to the structure 20 in FIG. 1. The layer 21 corresponding to the structure 20 forms the surface of a structure 20a having the multilayer structure.

The structure 20 is formed, for example, of a source material including yttrium oxyfluoride. This source material is manufactured, for example, by fluoridation treatment of yttria. The source material is broadly divided into two types of a high oxygen content and a low oxygen content by this manufacturing step. The source material of the high oxygen content includes, for example, YOF, YOF of 1:1:2 (for example, $Y_5O_4F_7$, $Y_7O_6F_9$ or the like). The source material of the high oxygen content may include only YOF. The source material of the low oxygen content includes, for example, $YF_3$ in addition to $Y_5O_4F_7$, $Y_7O_6F_9$ or the like, and does not include YOF. In the case where the sufficient fluoridation treatment is performed, the source material becomes to include only $YF_3$, and may not include yttrium oxyfluoride. In the embodiment, the structure includes rhombohedral yttrium oxyfluoride. The fact that the source material and the structure include a rhombohedral yttrium oxyfluoride is supposed to mean that a peak is detected at least one of near the diffraction angle 2θ=13.8° and near the diffraction angle 2θ=36.1° in the X-ray diffraction.

In the structure used for the semiconductor manufacturing apparatus or the like, $YF_3$, $Y_5O_4F_7$, $Y_7O_6F_9$ or the like are oxidized over the years, and may change to YOF. There is also a report saying that YOF is superior in corrosion resistance than other compositions (JP 2016-098143 A (Kokai)).

The inventors of the application have found that in the structure having yttrium oxyfluoride as a main component, the plasma resistance is correlated with the crystal structure of the structure, and the plasma resistance can be increased by controlling the crystal structure. The plasma resistance can be improved by controlling the crystal structure of yttrium oxyfluoride included in the structure.

Specifically, the crystal structure of the structure 20 according to the embodiment is as follows.

The structure 20 includes a polycrystalline substance of yttrium oxyfluoride having a rhombohedral crystal structure. In the X-ray diffraction of the structure 20, a proportion γ1 about a peak intensity of the rhombohedron is not less than 0% and less than 100%, preferably less than 80%.

Here, the proportion γ1 is calculated by the following method.

The X-ray diffraction is performed on the structure 20 including yttrium oxyfluoride in θ-2θ scanning. A peak intensity of the rhombohedron detected near the diffraction angle 2θ=13.8° by the X-ray diffraction on the structure 20 is taken as r1. A peak intensity of the rhombohedron detected near the diffraction angle 2θ=36.1° by the X-ray diffraction on the structure 20 is taken as r2. At this time, γ1(%)=r2/r1×100 is taken. For example, γ1 represents a degree of orientation of rhombohedral yttrium oxyfluoride.

It is considered that the peak near the diffraction angle 2θ=13.8° and the peak near the diffraction angle 2θ=36.1° are, for example, due to rhombohedral YOF, respectively.

Near 2θ=13.8° is, for example, approximately 13.8±0.4° (not less than 13.4° and not more than 14.2°), and near 36.1° is, for example, appropriately 36.1±0.4° (not less than 35.7° and not more than 36.5°).

The structure 20 includes yttrium oxyfluoride having the rhombohedral crystal structure, and does not include yttrium oxyfluoride having the orthorhombic crystal structure.

Or, the crystal structure 20 includes yttrium oxyfluoride having the rhombohedral crystal structure and yttrium oxyfluoride having the orthorhombic crystal structure, and a proportion γ2 of orthorhombus to rhombohedron is not less than 0% and less than 100%.

Here, the proportion γ2 is calculated by the following method.

The X-ray diffraction (XRD) is performed on the structure 20 including yttrium oxyfluoride in θ-2θ scanning. A peak intensity of the rhombohedron detected near the diffraction angle 2θ=13.8° by the X-ray diffraction is taken as r1. A peak intensity of the orthorhombus detected near the diffraction angle 2θ=16.1° by the X-ray diffraction is taken as o. At this time, γ2(%)=o/r1×100 is taken.

It is considered that the peak near the diffraction angle 2θ=16.1° is due to orthorhombic YOF of 1:1:2 (for example, at least one of orthorhombic $Y_5O_4F_7$ or $Y_7O_6F_9$).

Near 2θ=16.1° is, for example, approximately 16.1±0.4° (not less than 15.7° and not more than 16.5°)

The proportion γ2 of orthorhombus to rhombohedron is preferably not more than 85%, more preferably not more than 70%, further preferably not more than 30%, most preferably 0%. In the specification of the application, γ2=0% means not more than detection lower limit in the measurement, has the same meaning as substantially not including yttrium oxyfluoride having the orthorhombic crystal structure.

In the polycrystalline substance of yttrium oxyfluoride included in the structure, an average crystallite size is, for example, less than 100 nm, preferably less than 50 nm, further preferably less than 30 nm, most preferably 20 nm. Since the average crystallite size is small, particles generated by plasma can be small.

The X-ray diffraction can be used for measurement of the crystallite size.

The crystallite size can be calculated by the following Scheller's formula as the average crystallite size.

$$D=K\lambda/(\beta \cos \theta)$$

Here, D is a crystallite size, β is a peak half width (radian (rad)), θ is a Bragg angle (rad), and λ is a wavelength of the X-ray used for the measurement.

In the Scheller's formula, β is calculated from β=(βobs−βstd). βobs is a half width of the X-ray diffraction peak of a measurement sample, and βstd is a half width of the X-ray diffraction peak of a reference sample. K is a Scheller constant.

The X-ray diffraction peaks which can be used for calculation of the crystallite size in yttrium oxyfluoride are, for example, a peak due to a mirror plane (006) near the diffraction angle 2θ=28°, a peak due to a mirror plane (012) near the diffraction angle 2θ=29°, a peak due to a mirror plane (018) near the diffraction angle 2θ=47°, a peak due to a mirror plane (110) near the diffraction angle 2θ=48° or the like.

The crystallite size may be calculated from an image of TEM observation or the like. For example, an average value of a diameter equivalent to a circle of the crystallite can be used for the average crystallite size.

Figure 7:
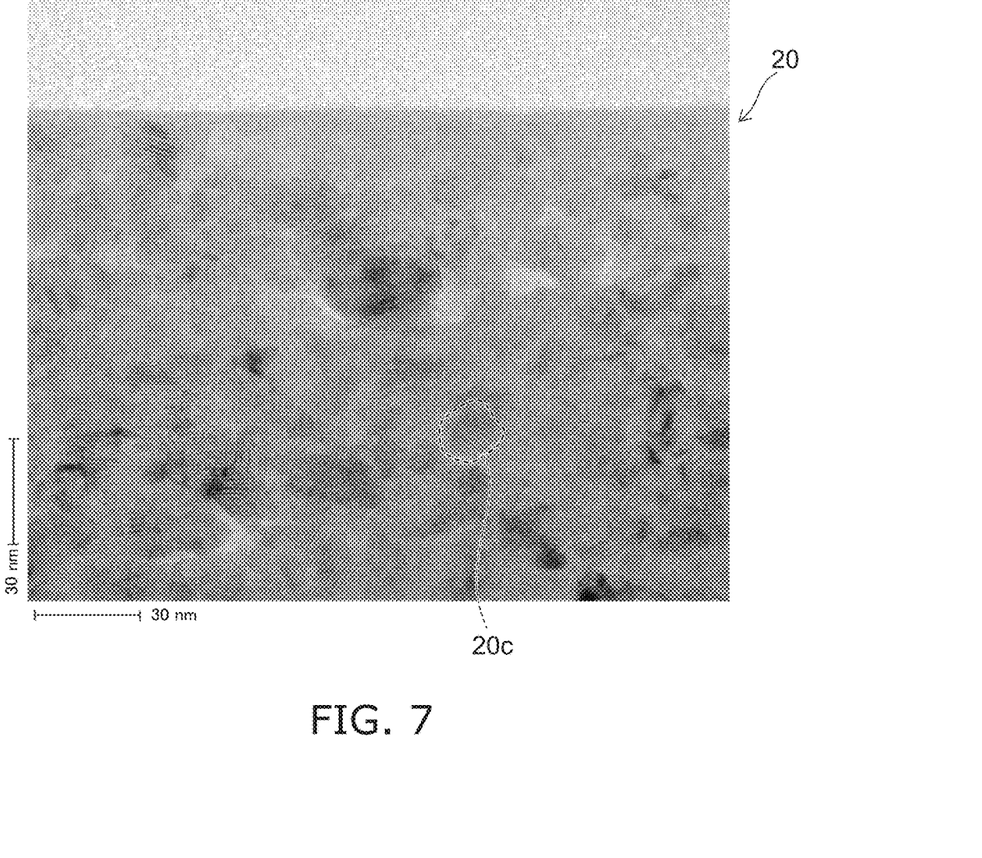
FIG. 7 is a photograph illustrating the structure according to the embodiment.

A spacing between adjacent crystallites each other is preferably not less than 0 nm and less than 10 nm. The spacing between adjacent crystallites is a spacing between the most adjacent crystallites, and does not include a gap formed from multiple crystallites. The spacing between the crystallites can be determined from the image obtained by the observation using a transmission electron microscope (TEM). FIG. 7 shows a TEM image of the observation of one example of the structure 20 according to the embodiment. The structure 20 includes multiple crystallites 20c (crystal particle).

For example, the structure 20 does not substantially include $Y_2O_3$. A peak intensity due to $Y_2O_3$ detected near the diffraction angle 2θ=29.1° on the X-ray diffraction in the θ-2θ scanning of the structure 20 is taken as ε. At this time, at least one of a proportion of ε to r1 (ε/r1) and a proportion of ε to r2 (ε/r2) is less than 1%, more preferably 0%. The structure 20 does not include $Y_2O_3$, or $Y_2O_3$ included in the structure 20 is slight, and thus fluoridation by CF-based plasma is suppressed and the plasma resistance can be further increased. Near 2θ=29.1° is approximately 29.1±0.4° (not less than 28.7° and not more than 29.5°).

The structure 20 according to the embodiment can be formed by disposing fine particles of a brittle material or the like on the surface of the base 15 and giving a mechanical impact force to the fine particles. Here, "giving mechanical impact force" method includes, for example, use of a compressive force by a shock wave generated at an explosion based on a brush or a roller of high hardness rotating at a high speed or a piston moving up and down at a high speed, or operation of an ultrasonic acoustic wave, or a combination of those.

The structure 20 according to the embodiment is preferably formed by, for example, an aerosol deposition method as well.

"The aerosol deposition method" is a method in which "aerosol" including the dispersed fine particles including a brittle material or the like into a gas is injected toward the base from a nozzle, the fine particles are collided to the base such as a metal, glass, ceramics, plastics or the like, deformation and crushing are caused to occur on the brittle material fine particles by the impact of the collision and these are bonded, and the structure (for example, layered structure or film-like structure) including constituent material of the fine particles is directly formed on the base. According to this method, it is possible to form the structure at the normal temperature without particular necessity of heating means and cooling means, and is possible to obtain the structure having a mechanical strength equal to or more than that of the sintered body. It is possible to change variously the density, the mechanical strength, and the electrical characteristics or the like of the structure by controlling the condition of collision of the fine particles, and shapes and compositions or the like of the fine particles.

In the specification of the application, "polycrystal" refers to the structure made by bonding/accumulating the crystal particles. A diameter of the crystal particle is, for example, not less than 5 nanometers (nm).

In the specification of the application, "fine particles" refers to particles having an average particle diameter of not more than 5 micrometers (μm), which is identified by a particle distribution measurement or a scanning electron microscope in the case of a primary particle being a dense particle. In the case of the primary particle being a porous particle which tends to be crushed by the shock, it refers to particles having an average particle diameter of not more than 50 μm.

In the specification of the application, "aerosol" indicates a solid/gas mixed phase body including the previously described particles dispersed in a gas (carrier gas) such as helium, nitrogen, oxygen, dry air, a mixed gas including those, and refers to a state in which the particles are substantially dispersed alone, although "aggregate" is included in some cases. Although a gas pressure and a temperature of the aerosol are arbitrary, it is desired for formation of the structure that a concentration of the particles in the gas is within a range of 0.0003 mL/L to 5 mL/L at injection from the discharge port in the case where the gas pressure is converted 1 atmospheric pressure, the temperature is converted to 20 degrees Celsius.

One feature of the process of the aerosol deposition is that it is performed ordinarily at the normal temperature, and it is possible to form the structure at a sufficiently lower temperature than a melting point of the fine particle material, namely not higher than a several hundred degrees Celsius.

In the specification of the application, "normal temperature" refers to an extremely lower temperature to a sintering temperature of ceramics, and a room temperature environment of substantially 0 to 100° C.

In the specification of the application, "powder" refers to a state in which the previously described fine particles are naturally aggregated.

In the following, the discussion of the inventors of the application will be described.

Figure 2:
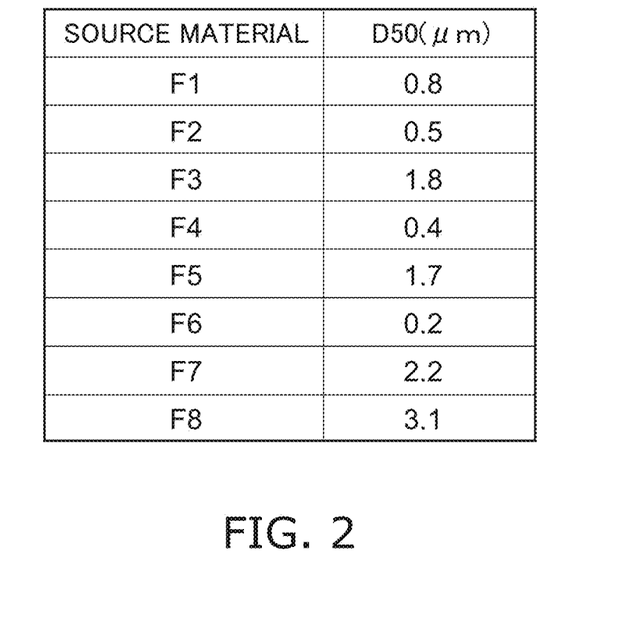
FIG. 2 is a table illustrating source materials of the structure.

FIG. 2 is a table illustrating the source materials of the structure.

In the discussion, 8 types of powder of the source materials F1 to F8 shown in FIG. 2 are used. These source materials are powders of yttrium oxyfluoride, and include at least one of YOF, and YOF of 1:1:2 (for example, $Y_5O_4F_7$, $Y_7O_6F_9$ or the like). The respective source materials do not include $YF_3$ and $Y_2O_3$ substantially.

Substantially not including $YF_3$ means that in the X-ray diffraction, a peak intensity due to $YF_3$ near the diffraction angle $2\theta=24.3°$ or near 25.7° is less than 1% of a peak intensity due to YOF near the diffraction angle $2\theta=13.8°$ or 36.1°. Substantially not including $YF_3$ means that in the X-ray diffraction, a peak intensity due to $YF_3$ near the diffraction angle $2\theta=24.3°$ or 25.7° is less than 1% of a peak intensity due to YOF of 1:1:2 near the diffraction angle $2\theta=32.8°$. Near the $2\theta=24.3°$ is, for example, approximately $24.3\pm0.4°$ (not less than 23.9° and not more than 24.7°). Near the $2\theta=25.7°$ is, for example, approximately $25.7\pm0.4°$ (not less than 25.3° and not more than 26.1°). Near the $2\theta=32.8°$ is, for example, approximately $32.8\pm0.4°$ (not less than 32.4° and not more than 33.2°).

Substantially not including $Y_2O_3$ means that in the X-ray diffraction, a peak intensity due to $Y_2O_3$ near the diffraction angle $2\theta=29.1°$ is less than 1% of a peak intensity due to YOF near the diffraction angle $2\theta=13.8°$ or near 36.1°. Or substantially not including $Y_2O_3$ means that in the X-ray diffraction, a peak intensity due to $Y_2O_3$ near the diffraction angle $2\theta=29.1°$ is less than 1% of a peak intensity due to YOF of 1:1:2 near the diffraction angle $2\theta=32.8°$.

The source materials F1 to F8 are different one another in a particle diameter like a median size (D50 (μm)) shown in FIG. 2. The median size is a diameter of 50% in a cumulative distribution of particle diameters of the respective source materials. The diameters of the respective particles are based on diameters determined in a circular approximation.

Samples of multiple structures (layered structure) are fabricated by changing the combination of these source materials and film manufacturing condition (type of flow rate of carrier gas), and the plasma resistance is evaluated. In this example, the aerosol deposition method is used for fabrication of the samples.

Figure 3:
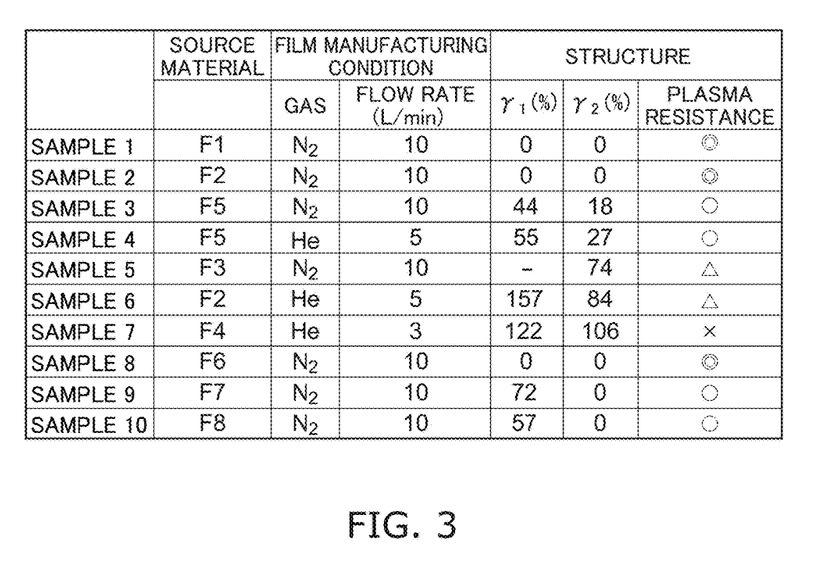
FIG. 3 is a table illustrating samples of the structure.

FIG. 3 is a table illustrating samples of the structure.

As shown in FIG. 3, nitrogen ($N_2$) or helium (He) is used for a carrier gas. The aerosol is obtained by mixing the carrier gas and source material powder (source material fine particle) in an aerosol generator. The obtained aerosol is injected by a pressure difference from a nozzle connected to the aerosol generator toward the base disposed inside a film manufacturing chamber. At this time, air in the film manufacturing chamber is evacuated to outside by a vacuum pump. The amount of flow rate of nitrogen is 5 (litter/minute: L/min) to 10 (L/min), and that of helium is 3 (L/min) to 5 (L/min).

Each of the structures of the samples 1 to 10 includes a polycrystalline substance of mainly yttrium oxyfluoride, and the average crystallite size in any polycrystalline substance is less than 100 nm.

The X-ray diffraction is used for measurement of the crystallite size.

The XRD device of "X'PertPRO/PANalytical made" is used. A tube voltage of 45 kV, a tube current of 40 mA, Step Size of 0.033°, Time per Step of not less than 366 seconds are used.

The crystallite size by the Scheller's formula described above is calculated as the average crystallite size. As a value of K in the Scheller's formula, 0.94 is used.

The X-ray diffraction is used for measurement of a main component of crystal phase of oxyfluoride of yttrium. The XRD device of "X'PertPRO/PANalytical made" is used. X-ray Cu-Kα (wavelength 1.5418 Å), a tube voltage of 45 kV, a tube current of 40 mA, Step Size of 0.033°, Time per Step of not less than 100 seconds are used. XRD analytical software "High Score Plus/PANalytical made" is used for calculation of the main component. The calculation is performed from a relative intensity ratio obtained on performing peak search to diffraction peaks by using a semi-quantitative value (RIR=Reference Intensity Ratio)

described in ICDD card. In the measurement of the main component of oxyfluoride of yttrium, it is desired to use measurement results of a depth region less than 1 μm from the outermost surface by thin film XRD.

The crystal structure of yttrium fluoride is evaluated by using the X-ray diffraction. The XRD device of "X'PertPRO/PANalytical made" is used. X-ray Cu-Kα (wavelength 1.5418 Å), a tube voltage of 45 kV, a tube current of 40 mA, and Step Size of 0.033° are used. It is preferable that Time per Step is not less than 700 seconds in order to improve measurement accuracy.

The proportion $\gamma1$ about the peak intensity of rhombohedron in oxyfluoride of yttrium is calculated by r2/r1×100(%) by using the peak intensity (r1) due to the rhombohedron of oxyfluoride of yttrium near the diffraction angle 2θ=13.8° and the peak intensity (r2) due to rhombohedron of oxyfluoride of yttrium near the diffraction angle 2θ=36.1°.

As described previously, the X-ray diffraction is used for measurement of the proportion $\gamma2$ of orthorhombus to rhombohedron in oxyfluoride of yttrium. The XRD device of "X'PertPRO/PANalytical made" is used. X-ray Cu-Kα (wavelength 1.5418 Å), a tube voltage of 45 kV, a tube current of 40 mA, and Step Size of 0.033° are used. It is preferable that Time per Step is not less than 700 seconds in order to improve measurement accuracy.

The proportion $\gamma2$ of orthorhombus to rhombohedron is calculated by the peak intensity (o) of orthorhombus/the peak intensity (r1) of rhombohedron×100(%) by using the peak intensity (r1) due to a mirror plane (003) of rhombohedron including YOF or the like near the diffraction angle 2θ=13.8° and the peak intensity (o) due to a mirror plane (100) of orthorhombus including $Y_7O_6F_9$ and $Y_5O_4F_7$ or the like near the diffraction angle 2θ=16.1°.

Figures 4A, 4B:
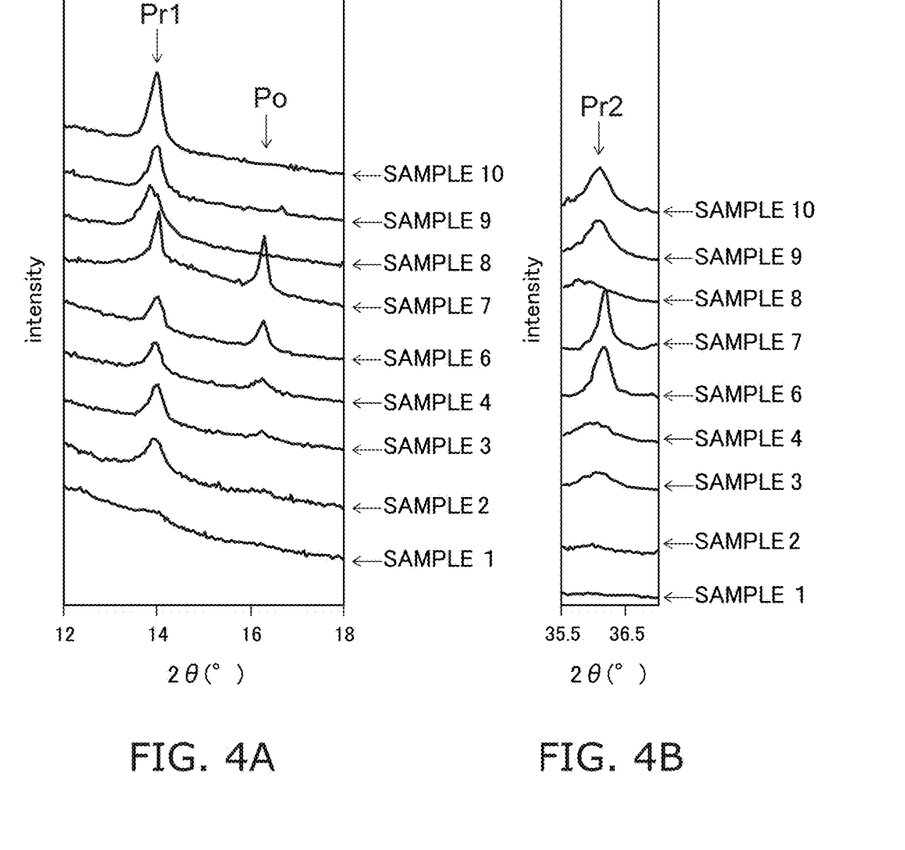
FIG. 4A and FIG. 4B are graph views showing X-ray diffraction in the samples of the structure.
Figure 5:
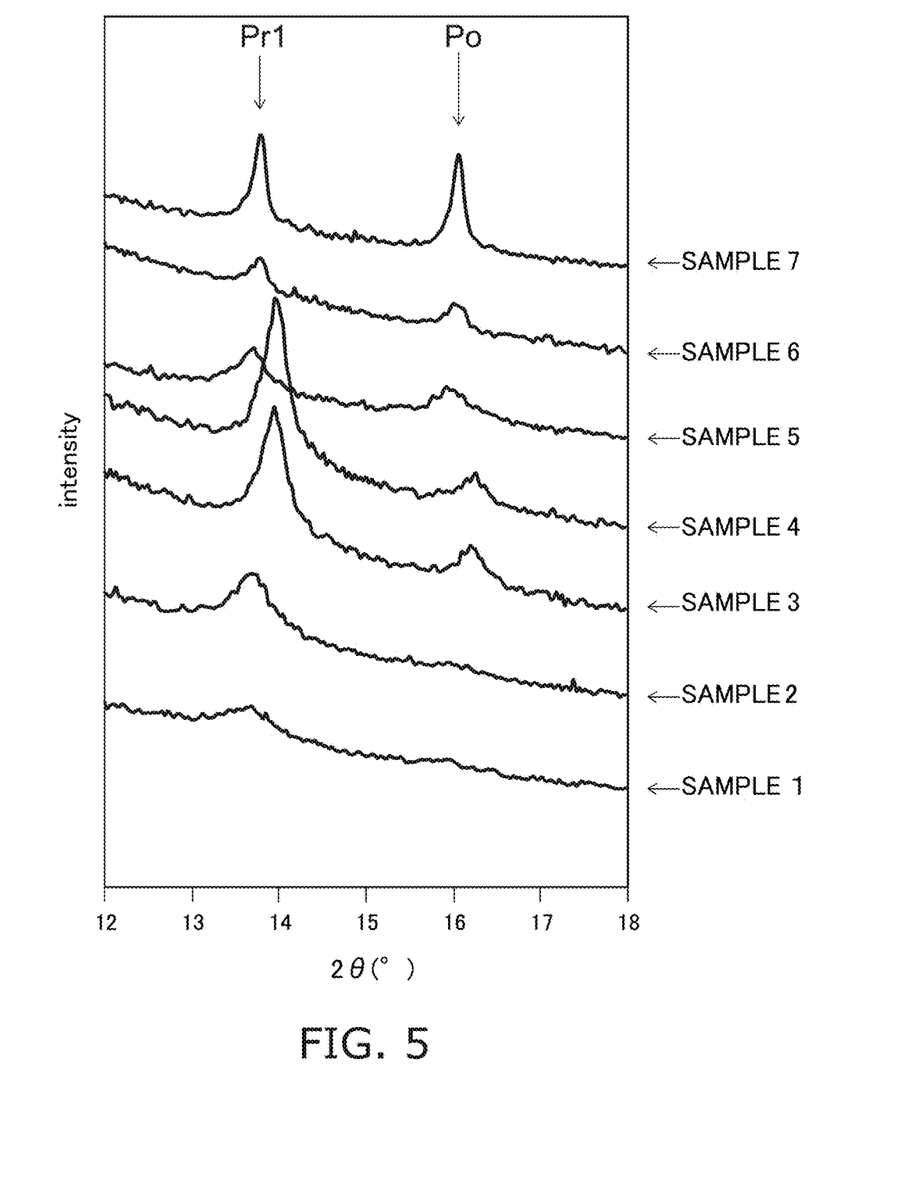
FIG. 5 is a graph view showing X-ray diffraction in the samples of the structure.

FIG. 4A, FIG. 4B and FIG. 5 are graph views showing the X-ray diffraction of the samples of the structure.

In each of FIG. 4A, FIG. 4B and FIG. 5, the horizontal axis represents the diffraction angle 2θ, and the vertical axis represents the intensity. As shown in FIG. 4A and FIG. 5, the samples 1 to 10 include rhombohedral yttrium oxyfluoride (for example, polycrystal of YOF), and a peak Pr1 is detected near the diffraction angle 2θ=13.8° in the respective samples. As shown in FIG. 4B, in each of the samples 3, 4, 6 to 10, a peak Pr2 is detected near the diffraction angle 2θ=36.1°. In the samples 1, 2, no peak is detected near the diffraction angle 2θ=36.1°.

As shown in FIG. 4A and FIG. 5, the samples 3 to 7 include orthorhombic yttrium oxyfluoride (for example, polycrystal of at least one of $Y_5O_4F_7$ or $Y_7O_6F_9$), and a peak Po is detected near the diffraction angle 2θ=16.1°. In the samples 1, 2, 8 to 10, no peak is detected near the diffraction angle 2θ=16.1°.

About the respective samples, in data shown in FIG. 4A and FIG. 5, the peak intensities (r1 and r2) previously described are calculated subtracting the intensity of the background, and the proportion $\gamma1$ about the peak intensity of rhombohedron is determined. About the respective samples, in data shown in FIG. 5, the peak intensities (r1 and o) previously described are calculated subtracting the intensity of the background, and the proportion $\gamma2$ of orhorhombus to rhombohedron is determined. The determined proportion $\gamma1$ and the proportion $\gamma2$ are shown in FIG. 3.

As shown in FIG. 3, the proportion $\gamma1$ changes greatly depending on the combination of the source material and the film formation condition. The inventors of the application have found that the orientation of rhombohedral yttrium oxyfluoride is related to the plasma resistance.

The proportion $\gamma2$ also changes greatly depending on the combination of the source material and the film forming condition. The inventors of the application have found for the first time that a proportion of the compound in the structure changes like this depending on the film forming condition or the like. For example, in the source material powder with a large amount of oxygen content such as the source materials F1 to F5, the proportion $\gamma2$ of orthorhombus to rhombohedron is not less than 50% and not more than 100%. In contrast, the proportion $\gamma2$ is 0% in the samples 1, 2 and exceeds 100% in the sample 7 by film manufacturing by the aerosol deposition method.

In all of the samples 1 to 10, no peak with intensity is detected near the diffraction angle 2θ=29.1°. That is, the proportion of the peak intensity E to the peak intensity r1 is 0% subtracting the background intensity, and the samples 1 to 10 do not include $Y_2O_3$.

The plasma resistance is evaluated on these samples 1 to 7.

A plasma etching apparatus and a surface shape measurement instrument are used for the evaluation of plasma resistance of oxyfluoride of yttrium.

The plasma etching apparatus of "Muc-21 Rv-Aps-Se/Sumitomo Precision Products made" is used. The condition of the plasma etching is set as follows, about a power output, an ICP output is 1500 W, a bias output is 750 W, a process gas is a mixed gas of $CHF_3$ 100 ccm and $O_2$ 10 ccm, a pressure is 0.5 Pa, a plasma etching time is 1 hour.

A surface roughness measurement instrument of "SURFCOM 1500DX/TOKYO SEIMITSU made" is used. The arithmetic average roughness Ra is used for an index of surface roughness. The reference value fitting to the arithmetic average roughness Ra of the measurement result is used based on JISB0601 for Cut Off and evaluation length in the measurement of the arithmetic average roughness Ra.

The plasma resistance is evaluated from a surface roughness change amount ($Ra_1 - Ra_0$) by using a surface roughness $Ra_0$ before the plasma etching of the sample and a surface roughness $Ra_1$ after the plasma etching of the sample.

FIG. 3 shows evaluation results of the plasma resistance. "O" indicates the plasma resistance higher than that of the sintered body of yttria. "double circle" indicates the plasma resistance higher than that of "O" and equal to or higher than that of the yttria structure fabricated by the aerosol deposition method. "triangle" indicates the plasma resistance lower than that of "O" and approximately equal to that of the sintered body of yttria. "x" indicates the plasma resistance lower than that of "triangle".

The inventors of the application have found that the plasma resistance is correlated with the proportion $\gamma1$ as shown in FIG. 3. That is, in the samples 6, 7 having the proportion $\gamma1$ not less than 100%, the plasma resistance is low. The practically sufficient plasma resistance can be obtained by controlling the proportion $\gamma1$ to be less than 100% by the film forming condition or the like.

The plasma resistance can be higher than that of the sintered body of yttria like the samples 3, 4, 9, 10 by setting the proportion $\gamma1$ less than 80%.

The plasma resistance can be increased equal to or more than that of the yttria structure fabricated by the aerosol deposition method like the samples 1, 2, 8 by setting the proportion $\gamma1$ to be 0%.

Furthermore, the inventors of the application have found that the plasma resistance is correlated with the proportion $\gamma2$ as shown in FIG. 3. That is, in the sample 7 having the proportion $\gamma2$ not less than 106%, the plasma resistance is low. In the structure 20 according to the embodiment, the plasma resistance can be increased and the practically sufficient plasma resistance can be obtained by regulating the film forming condition or the like to control the proportion γ2 to be less than 100%.

The plasma resistance can be increased equal to that of the sintered body of yttria like the samples 5, 6 by setting the proportion γ2 to be not more than 85%, preferably not more than 70%.

The plasma resistance can be increased equal to that of the structure of yttria by the aerosol deposition method like the samples 3, 4 by setting the proportion γ2 to be not more than 30%.

The plasma resistance can be further increased like the samples 1, 2 by setting the proportion γ2 to be 0%.

In the case where the structure of the oxide such as $Al_2O_3$ and $Y_2O_3$ or the like is formed by using the aerosol deposition method in general, it is known that the structure has no crystal orientation.

On the other hand, since $YF_3$ and yttrium oxyfluoride or the like are cleavable, for example, the fine particle of the source material tends to break along a cleavage plane by the mechanical shock being given. Therefore, it is considered that the fine particle breaks along the cleavage plane on film manufacturing by the mechanical impact force, and the structure orientates along the specific crystal direction.

In the case where the source material is cleavable, there is a fear that if the structure is damaged by plasma irradiation, cracks occur along the cleavage plane, and the particles are generated from this. Then, the fine particles are crushed in advance along the cleavage plane on forming the structure, and the orientation is regulated. Specifically, the proportions γ1, γ2 are regulated. Thereby, it is considered that the plasma resistance can be improved.

The embodiment of the invention has been described with reference to specific examples. However, the invention is not limited to these specific examples. For example, those skilled in the art can suitably modify the above embodiment or examples also encompassed within the scope of the invention as long as they fall within the spirit of the invention. For example, the shape, the dimension, the material, the disposition or the like of the structure and the base or the like are not limited to the illustration and can be modified appropriately.

The components included in the respective embodiments previously described can be combined within the extent of the technical feasibility and these combinations are also encompassed in the scope of the invention as long as they fall within the feature of the invention.

What is claimed is:

1. A structure including a polycrystalline substance of yttrium oxyfluoride as a main component, the yttrium oxyfluoride having a rhombohedral crystal structure, and an average crystallite size of the polycrystalline substance being less than 100 nanometers,
   when taking a peak intensity of rhombohedron detected near diffraction angle 2θ=13.8° by X-ray diffraction as r1, taking a peak intensity of rhombohedron detected near diffraction angle 2θ=36.1° as r2, and taking a proportion γ1 as γ1(%)=r2/r1×100,
   the proportion γ1 being not less than 0% and less than 100%.
2. The structure according to claim 1, wherein the proportion γ1 is less than 80%.
3. The structure according to claim 1, wherein
   the structure does not include yttrium oxyfluoride having an orthorhombic crystal structure, or
   further includes yttrium oxyfluoride having the orthorhombic crystal structure,
   when taking a peak intensity of orthorhombus detected near a diffraction angle 2θ=16.1° by X-ray diffraction as o, and taking a proportion of orthorhombus to rhombohedron as γ2(%)=o/r1×100, the proportion γ2 is not less than 0% and less than 100%.
4. The structure according to claim 1, wherein the yttrium oxyfluoride having the rhombohedral crystal structure is YOF.
5. The structure according to claim 3, wherein the yttrium oxyfluoride having the orthorhombic crystal structure is YOF of 1:1:2 (molar ratio is Y:O:F=1:1:2).
6. The structure according to claim 3, wherein the proportion γ2 is not more than 85%.
7. The structure according to claim 3, wherein the proportion γ2 is not more than 70%.
8. The structure according to claim 3, wherein the proportion γ2 is not more than 30%.
9. The structure according to claim 1, wherein the average crystallite size is less than 50 nanometers.
10. The structure according to claim 1, wherein the average crystallite size is less than 30 nanometers.
11. The structure according to claim 1, wherein the average crystallite size is less than 20 nanometers.
12. The structure according to claim 1, wherein
   when taking a peak intensity detected near diffraction angle 2θ=29.1° by X-ray diffraction as ε, at least one of a proportion of the ε to the r1 and a proportion of the ε to the r2 is less than 1%.
13. The structure according to claim 1, wherein
   when taking a peak intensity detected near diffraction angle 2θ=29.1° by X-ray diffraction as ε, at least one of a proportion of the ε to the r1 and a proportion of the ε to the r2 is 0%.

* * * * *